United States Patent [19]

Boyle

[11] Patent Number: 4,626,779
[45] Date of Patent: Dec. 2, 1986

[54] SPRING-STOPS FOR A BI-LEVEL TEST FIXTURE

[75] Inventor: Michael C. Boyle, Norton, Mass.

[73] Assignee: Pylon Company, Inc., Attleboro Falls, Mass.

[21] Appl. No.: 713,476

[22] Filed: Mar. 19, 1985

[51] Int. Cl.$^4$ ............................................. G01R 31/02
[52] U.S. Cl. .............................. 324/158 F; 324/73 PC
[58] Field of Search ............... 324/158 F, 158 P, 72.5, 324/73 PC

[56] References Cited

U.S. PATENT DOCUMENTS

| | | | |
|---|---|---|---|
| 3,676,776 | 7/1972 | Bauer | 324/158 P |
| 3,757,219 | 9/1973 | Aksu | 324/158 F |
| 3,891,924 | 6/1975 | Ardezzone et al. | 324/158 P |
| 4,055,805 | 10/1977 | Ardezzone | 324/158 P |
| 4,056,777 | 11/1977 | Roch | 324/158 P |
| 4,099,120 | 7/1978 | Aksu | 324/158 P |
| 4,112,363 | 9/1978 | Morrison et al. | 324/158 P |
| 4,115,735 | 9/1978 | Stanford | 324/158 F |
| 4,164,704 | 8/1979 | Kato et al. | 324/158 F |
| 4,357,062 | 11/1982 | Everett | 324/158 F |
| 4,536,051 | 8/1985 | Smith et al. | 324/158 F |

Primary Examiner—Ernest F. Karlsen
Attorney, Agent, or Firm—Weingarten, Schurgin, Gagnebin & Hayes

[57] ABSTRACT

Improved spring-stops for a bi-level test fixture of the type that includes an electronic circuit device receiving face moveable between in-circuit and functional testing levels of a probe support plate are disclosed. A spring-loaded plate is provided below the probe support plate, and a plurality of elongated rods that extend between the electronic circuit device receiving face and the spring-loaded plate are provided for transferring the resilient force of the spring-loaded plate to the electronic circuit device receiving face. The transferred resilient force opposes the force exerted on the electronic circuit device receiving face from either operator or automatic testing equipment selectable vacuum levels such that the electronic circuit device receiving face moves to a selected one of the incircuit and functional testing levels. The rods are individually friction-fit for reciprocating motion in a low coefficient of friction and low compressive strength bushing. Each bushing is friction-fit into a corresponding opening provided therefor in the probe support plate. The low compressive strength and low coefficient of friction material of the bushings normalizes reciprocating rod motion induced strain in such a way as to substantially eliminate rod seizing while maintaining an air-tight seal.

9 Claims, 5 Drawing Figures

SPRING-STOPS FOR A BI-LEVEL TEST FIXTURE

FIELD OF THE INVENTION

The invention is directed to the field of automatic testing equipment, and more particularly, to novel spring-stops for a bi-level test fixture.

BACKGROUND OF THE INVENTION

The novel bi-level vacuum-actuated test fixture disclosed in United States utility patent application Ser. No. 586,010, invented by Golder et al and assigned to the same assignee as the instant invention, incorporated herein by reference, includes an electronic circuit device receiving face that is mounted for movement relative to a fixed probe support plate in such a way as to define a vacuum chamber therebetween. The probe support plate has mounted thereto a plurality of spring-loaded probes having ends that are constrained to lie on a first level defining an in-circuit testing array, and has mounted thereto a plurality of spring-loaded probes having ends that are constrained to lie on a second level different from the first level defining a functional testing array. A plurality of coil springs are mounted between and abutting the probe support plate and the electronic circuit board receiving face, and a plurality of spring-loaded buttons are mounted to the probe support plate. A bi-level vacuum source is operatively coupled to the vacuum chamber for selectively providing first and second preselected vacuum levels thereto. The first vacuum level is selected to have a magnitude greater than the combined resilient force provided by the plurality of coil springs but less than the resilient force of the coil springs and the spring-loaded buttons. The second preselected vacuum level is selected to have a magnitude greater than the combined resilient force of both the plurality of coil springs and of the spring-loaded buttons. Whenever the first, and lower, vacuum level is applied to the vacuum chamber, an electronic circuit device mounted to its receiving face is moved therewith into mechanical and electrical contact with the first plurality of spring-loaded probes as a result of a dynamic equilibrium condition established by the opposition between the vacuum pressure induced downward force and the upward conbined spring force of the springs and spring-loaded buttons. Whenever the full, and higher, vacuum level is applied to the vacuum chamber, the vacuum pressure induced force is sufficient to overcome the combined resilient force of the plurality of coil springs and spring-loaded buttons such that the electronic circut device moves into contact with the second plurality of spring-loaded probes.

SUMMARY OF THE INVENTION

The improved spring-stops for a bi-level test fixture of the present invention includes a spring-loaded plate mounted to the test fixture and subjacent the probe support plate for reciprocating motion in a direction defined by the normal to its plane. A plurality of elongated rods having ends are mounted in air-tight sealing relation to the probe support plate for reciprocating motion in a direction along their length, with one of their ends confronting the electronic circuit device receiving face and with the other of their ends abutting the spring-loaded plate. The rods are operative to transfer the resilient force of the spring-loaded plate to the electronic circuit device receiving face and cooperates with the selectable partial and full vacuum levels for providing either in-circuit or functional testing of the printed circuit board. The rods individually are preferably force-fit in a corresponding bushing provided therefor, and the bushings are preferably force-fit in a corresponding bushing receiving aperture provided therefor through the probe support plate. The bushings preferably are annuli fabricated from a low compressive strength and low coefficient of friction material such as TEFLON.

Among other advantages, the rods of the improved spring-stops for a bilevel test fixture of the present invention are comparatively much less expensive than the spring-loaded buttons. The rods, moreover, each have a comparatively smaller diameter and are capable of being mounted in the innerspace defined between adjacent ones of the spring-loaded probes. The rods, furthermore, more readily provide a uniform force distribution. In this manner, pre-assembled universal test fixtures, with attendant economies of scale, may be provided.

BRIEF DESCRIPTION OF THE DRAWINGS

These and other features and attendant advantages of the present invention will become apparent as the invention becomes better understood by referring to the following detailed description of a preferred embodiment thereof, and to the drawings, wherein.

DETAILED DESCRIPTION OF THE PREFERRED EMBODIMENT

Figure 1:
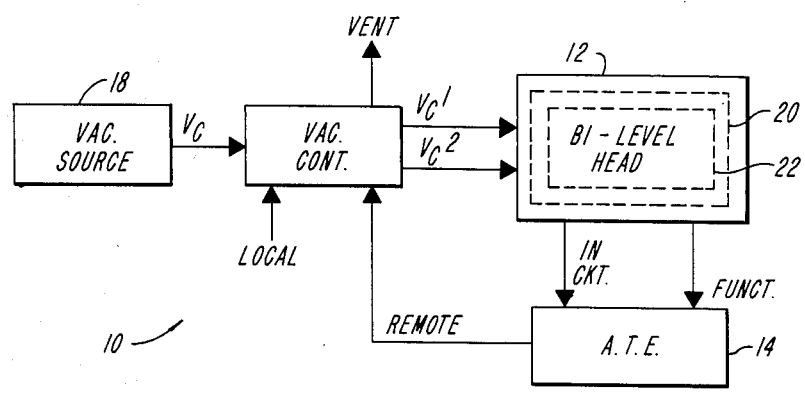
FIG. 1 is a block diagram illustrating a system in which the improved apring-stops for a bi-level test fixture of the present invention has exemplary utility.

Referring now to FIG. 1, generally designated at 10 is a block diagram illustrating a system in which the improved spring-stop for a bi-level test fixture according to the present invention has exemplary utility. The system 10 includes a bi-level test fixture generally designated 12 having improved spring-stops to be described operatively connected to automatic testing equipment (ATE) 14 for providing both in-circuit and functional testing of an electronic circuit device, not shown, mounted on the test fixture 12. A vacuum controller generally designated 16 is operatively connected to a vacuum source 18 and to the bi-level test fixture 12. The vacuum source provides a vacuum pressure designated $V_c$. The vacuum controller 16 is responsive to the vacuum pressure provided by the vacuum source 18 to selectively provide a partial vacuum pressure designated "$V_c1$", and a full vacuum pressure designated "$V_c2$", to the bi-level fixture 12 either by operator selection designated "local" or by the automatic testing equipment 14 designated "remote". The vacuum controller is operative as it switches between the paritial and full vacuum levels to release the vacuum to ambient designated "VENT".

The bi-level test fixture 12 is operative in response to the first vacuum level ($V_c1$) to electrically connect the electronic circuit device mounted on the fixture 12 to the automatic testing equipment 14 for in-circuit testing as designated by a dashed rectangle 20. The bi-level test fixture 12 is further operative in response to the second vacuum level ($V_c2$) to electrically connect the electronic circuit device to be tested to the automatic testing equipment 14 for functional testing as designated by a dashed rectangle 22. Reference may be had to the above copending application for a further description of the manner of operation and structure of an exemplary embodiment of the bi-level test fixture.

Figure 2A:
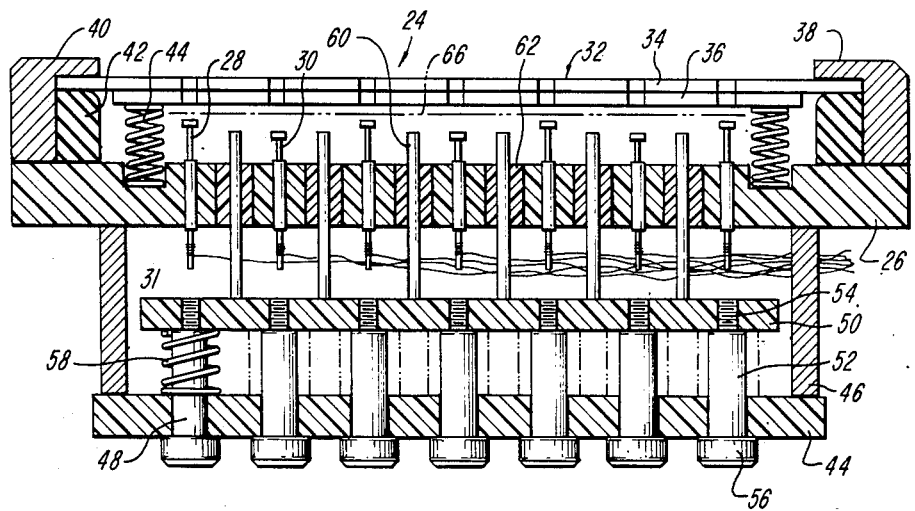
FIG. 2 is a partially sectional pictorial view illustrating in FIGS. 2A, 2B, and 2C thereof various operating states of the improved spring-stops for a bi-level test fixture according to the present invention.

Referring now to FIG. 2A, generally designated at 24 is a partially sectional pictorial view illustrating the improved spring-stops for a bi-level test fixture according to the present invention. The system 24 includes a probe support plate 26. A first plurality of spring-loaded probes 28, preferably POGO contacts, are mounted to the probe support plate 26 with their ends constrained to lie on a first level for providing a functional testing array pattern. A second plurality of spring-loaded probes 30, preferably POGO contacts, are mounted to the probe support plate 28 with their ends constrained to lie on a second level for providing an in-circuit testing array. The probes 28, 30 are respectively electrically connected by extending wires 31 to automatic testing equipment, not illustrated.

An electronic circuit device receiving face generally designated 32 is mounted in air-tight sealing relation to the probe support plate 28 for reciprocating motion along a direction defined by the normal to its plane defining therebetween a vacuum chamber. The vacuum chamber is operatively connected to the vacuum controller described above in connection with the description of FIG. 1. The face 32 preferably includes an elastomeric layer 34 of comparatively large cross-sectional area adhesively fastened to a subjacent rigid member 36 of comparatively smaller cross-sectional area defining an extending resilient peripheral lip 38. The electronic circuit device receiving face 32 is preferably mounted for reciprocating motion relative to the probe plate 26 by resilient hinges formed by capturing the peripheral lip 38 in air-tight channels defined between the confronting surfaces of flanges 40, 42 that are fastened in air-tight sealing engagement along the sides and edges of the probe plate 26, and by a plurality of upstanding coil springs 44 extending between and abutting the probe plate 26 and the rigid member 36 of the electronic circuit device receiving face 32. Reference may be had to the above co-pending application for a further description of the test fixture. A plate 44 is fastened in spaced-apart parallel relation to and below the probe support plate 26 by support struts 46 fastened by any suitable means to the probe plate 26 and the fixed plate 44. The fixed plate 44 has a plurality of spaced apertures generally designated 48 therethrough. A spring-loaded plate 50 is mounted for reciprocating motion relative to the fixed plate 44 on posts 52 threadably fastened as at 54 on an end thereby to the plate 50, and slidably inserted in corresponding ones of the apertures 48. The other ends of the posts 52, which preferably are so-called shoulder screws, have enlarged head portions 56 that provide abutments that prevent the posts from sliding out of their corresponding apertures 48. A plurality of coil springs 58 are slidably mounted on the posts 52 between and abutting the spring-loaded plate 54 and the fixed plate 44 with a preselected pre-load tension.

A plurality of rods 60 is mounted by any suitable means in air-tight sealing relation for reciprocating motion through the probe plate 26. The rods 60 preferably are fashioned from a comparatively rigid material such as stainless steel, and have a cross-sectional dimension that is selected to both allow their uniform distribution about the probe support plate 26 and in the innerspace defined between the probes 28, 30 thereof. The rods 60 are upwardly extending and have such a length that one of the ends of each of the rods is in abutting relation with the spring-loaded plate 50 and the other of the ends of each of the rods terminate in confronting relation with the bottom surface of the member 36 of the electronic circuit device receiving face 32. The rods 60, as appears below, act as force transfer columns that couple the resilient force of the pre-loaded spring-biased plate 60 upwardly therealong, and in such a way as to bear against the rigid member 36 of the electronic circuit device receiving face 32 during the operation of the test fixture.

Figure 3:
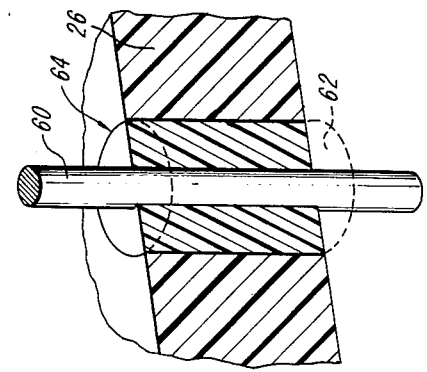
FIG. 3 is a partially broken away perspective view illustrating a portion of the improved spring-stops for a bi-level test fixture according to the present invention.

As can best be seen in FIG. 3, each of the rods 60 is preferably friction-fit in a bushing 62, with the confronting walls of the rod and bushing in air-tight sealing relationship. The bushings 62 are each preferably friction-fit in air-tight sealing engagement with the confronting walls of apertures generally designated 64 provided therefor through the probe support plate 26. The bushings 62 are preferably fabricated from any suitable low compressive strength and low coefficient of friction material such as TEFLON, which may be provided with any suitable reinforcing material.

The air-tight friction-fit of the rods in the bushings and the friction-fit of the bushings in the apertures provided therefor in the probe support plate prevent undesirable vacuum leakage therethrough. The contacting surface area defined between the confronting walls of each of the bushings with the apertures provided therefor through the probe support plate is comparatively much larger than the contacting surface area defined between the rods and each of the bushings. The frictional force produced between the rods and the bushings and the frictional force produced between the walls of the apertures provided therefor and the bushings are proportional to their respective contacting surface areas. The frictional withdrawal force produced by the rods is thus insufficient to overcome the retaining frictional force of the bushings so that the bushings remain seated and are securely retained in the apertures provided therefor during reciprocating rod movement therethrough.

The low coefficient of friction cooperates with the low compressive strength of the material of the bushings to prevent the rods from locking as they reciprocally move through the bushings. During reciprocating motion, the material of the bushings flows to normalize any motion-induced strain, and in such a way as to prevent seizing of the rod while preserving the air-tight seal therebetween. The low compressive strength material of the bushings likewise flows and so distributes itself as to normalize any strain induced by misaligned rods, and likewise prevents seizing engagement of the rods while preserving the air-tight seal.

In operation, and as shown in FIG. 2A, with no vacuum being applied to the test fixture, the resilience provided by the springs 43 urge the electronic circuit device receiving face 32 upwardly such that the contact points of the electronic circuit device to be tested are out of mechanical and electrical contact with the in-circuit and functional testing arrays as schematically illustrated in dashed line 66. As shown in FIG. 2B for the case when the partial vacuum condition is being applied to the vacuum chamber of the test fixture, the resulting atmospheric pressure is sufficient to cause the electronic circuit device receiving face 32 to move downwardly against the upward force provided by the springs 44 and into contact with the confronting ends of the rods 60. The downward force induced on the electronic circuit device receiving face produced by the partial vacuum level, selected to have a magnitude sufficient to overcome the resilient force of the springs 44 but insufficient to overcome the resilient force transferred to the electronic circuit device receiving face 32 from the spring-loaded plate 50 via the rods 60, is dynamically balanced by the upward force exerted by the springs 44 and rods 60 such that the electronic circuit device receiving force assumes the position where the contact points of the electronic circut device to be tested mechanically contact and electrically connect the probes 28 defining the functional testing array but not the probes 30 defining the in-circuit array as schematically illustrated in dashed line 68.

Figure 2C:
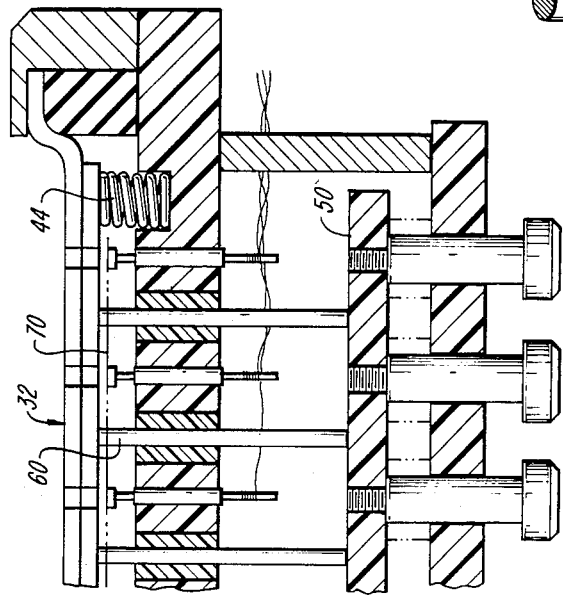
Figure 2B:
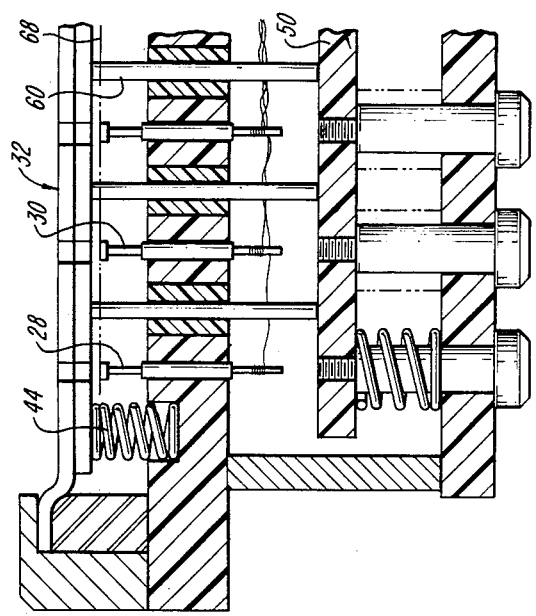

As shown in FIG. 2C for the full vacuum level case, which has a magnitude sufficient to overcome the resilient force of the springs 44 and of the resilient force transferred by the rods 60, the electronic circuit device receiving face 32 moves downwardly pushing the rods 60 and therewith the spring-loaded plate 50 downwardly until the contacts of the electronic circuit device to be tested mechanically contact and electrically connect with the probes 30 defining the functional testing array as well as with the probes 28 as schematically illustrated in dashed line 70. When the vacuum is either removed or lowered, the electronic circuit device receiving face 32 either is urged back to its nominal position (FIG. 2A) or back to its dynamically stable position (FIG. 2B) by the pre-load tension of the plate 50 and by the coil springs 44.

Many modifications of the presently disclosed invention will become apparent to those skilled in the art without departing from the scope of the appended claims.

What is claimed is:

1. A test fixture for providing in-circuit and functional testing of electronic circuit devices by automatic testing equipment, comprising:
    a probe support plate;
    a first plurality of spring-loaded contacts fastened to the probe support plate with their contact ends constrained to lie on a first plane defining a functional testing array pattern;
    a second plurality of upstanding spring-loaded contacts fastened to the probe plate with their contact ends constrained to lie in a second plane different from the first plane defining an in-circuit contact array pattern;
    an electronic circuit device receiving face;
    means for mounting the electronic circuit device receiving face for reciprocating motion relative to the probe plate in a direction defined by the normal to its plane;
    a spring-loaded plate spaced from and generally parallel to the probe plate;
    means for mounting the spring-loaded plate to the probe plate for reciprocating motion along a direction defined by the normal to its plane;
    a plurality of elongated rods having ends; and
    means for mounting the plurality of rods for sliding motion relative to the probe plate with one of the ends of each of the rods confronting the electronic circuit device receiving face and with the other end of each of the rods confronting the spring-loaded plate.

2. The invention of claim 1, wherein said upstanding spring-loaded contacts have a center-to-center spacing, and wherein said rods each have a preselected diameter selected to allow their placement within the innerspace defined by the center-to-center spacing of the spring-loaded probes.

3. The invention of claim 1, wherein said rod mounting means include means for mounting said rods for reciprocating motion in air-tight sealing relation with said probe plate.

4. The invention of claim 3, wherein said rod mounting means includes a plurality of bushings each having a rod receiving opening.

5. The invention of claim 4, wherein said probe plate has bushing receiving apertures therethrough, and wherein said rods are press-fit within said rod receiving openings of said bushings and wherein said bushings having said press-fit rods are press-fit into said bushing receiving apertures of the probe plate.

6. The invention of claim 4, wherein said bushings are fashioned from a low compressive strength and low coefficient of friction material.

7. The invention of claim 1, wherein said spring-loaded plate mounting means includes a plate having apertures fastened to said probe plate, and a plurality of posts slidably mounted in said apertures and fastened to said spring-loaded plate.

8. The invention of claim 7, wherein each of said posts have a flange on the ends thereof remote from the ends thereof fastened to the spring-loaded plate that each abut said plate.

9. The invention of claim 8, wherein a plurality of coil springs are slidably mounted on corresponding posts between and abutting said plate and spring-loaded plated in such a way as to exert a preselected pre-load on said spring-loaded plate.

* * * * *

UNITED STATES PATENT AND TRADEMARK OFFICE
CERTIFICATE OF CORRECTION

PATENT NO. : 4,626,779

DATED : December 2, 1986

INVENTOR(S) : Michael C. Boyle

It is certified that error appears in the above-identified patent and that said Letters Patent is hereby corrected as shown below:

IN THE ABSTRACT, line 15, "incircuit" should read --in-circuit--.

Column 1, line 45, "conbined" should read --combined--.

Column 1, line 51, "circut" should read --circuit--.

Column 2, line 29, "apring-stops" should read --spring-stops--.

Column 2, line 44, "spring-stop" should read --spring-stops--.

Column 2, line 62, "paritial" should read --partial--.

Column 3, line 20, "plate 28" should read --plate 26--.

Column 3, line 27, "plate 28" should read --plate 26--.

UNITED STATES PATENT AND TRADEMARK OFFICE
CERTIFICATE OF CORRECTION

PATENT NO. : 4,626,779

DATED : December 2, 1986

INVENTOR(S) : Michael C. Boyle

It is certified that error appears in the above—identified patent and that said Letters Patent is hereby corrected as shown below:

Column 3, line 48, "fixture. A plate", new paragraph should start with "A plate".

Column 5, line 16, "circut" should read --circuit--.

Signed and Sealed this

Sixteenth Day of February, 1988

Attest:

DONALD J. QUIGG

Attesting Officer

Commissioner of Patents and Trademarks